United States Patent [19]

Haruta et al.

[11] Patent Number: 5,035,749

[45] Date of Patent: Jul. 30, 1991

[54] PROCESS FOR REMOVING TIN AND TIN-LEAD ALLOY FROM COPPER SUBSTRATES

[75] Inventors: Takashi Haruta; Takaharu Nagano, both of Amagasaki; Takeyoshi Kishimoto, Yamatokoriyama; Yasushi Yamada, Osaka; Tomoko Yuno, Suita, all of Japan

[73] Assignee: MEC Co., Ltd., Hyogo, Japan

[21] Appl. No.: 563,197

[22] Filed: Aug. 6, 1990

[30] Foreign Application Priority Data

Aug. 18, 1989 [JP] Japan ................................. 1-211497

[51] Int. Cl.$^5$ ................................................. C23G 1/00
[52] U.S. Cl. ............................................. 134/2; 134/3; 134/26; 252/79.4; 156/651; 156/656; 156/664
[58] Field of Search ................. 134/2, 3, 26; 252/79.4, 252/79.2; 156/656, 651, 664

[56] References Cited

U.S. PATENT DOCUMENTS

| | | | |
|---|---|---|---|
| Re. 32,555 | 12/1987 | Czaja | 252/142 |
| 4,374,744 | 2/1983 | Kawanabe et al. | 134/3 |
| 4,379,834 | 4/1983 | Herwing et al. | 134/3 |
| 4,397,753 | 8/1983 | Czaja | 134/3 |
| 4,687,545 | 8/1987 | Williams et al. | |
| 4,713,144 | 12/1987 | Schiller | 134/3 |

*Primary Examiner*—Theodore Morris
*Assistant Examiner*—Saeed Chaudhry
*Attorney, Agent, or Firm*—Oliff & Berridge

[57] ABSTRACT

Disclosed is a method for removing a layer of tin or tin-lead alloy from a copper substrate of a printed circuit board employing the two different reagents in a two-step procedure without damaging the substrate, and at the same time, preventing formation of whitish precipitates in the treating solution.

In the first step, the layer of tin or tin-lead alloy is selectively removed with the first reagent having a comparatively mild oxidation capability, then in the second step the intermetallic layer consisting of tin and copper is removed with the second reagent having a comparatively strong oxidation capability.

This process ensures a smooth and effective operation in the production of high quality printed circuit boards.

3 Claims, No Drawings

PROCESS FOR REMOVING TIN AND TIN-LEAD ALLOY FROM COPPER SUBSTRATES

BACKGROUND OF THE INVENTION

1. Field of the Invention

This invention relates to a process for removing a layer of tin or tin-lead alloy from the surface of a printed circuit board. More particularly, it provides, in the manufacturing process of printed circuit boards, a method for selectively removing the layer of tin or tin-lead alloy in a short period of time from the copper substrates without damaging the substrates while preventing formation of whitish precipitates in the treating solution.

2. Description of the Background Art

Conventionally, a layer of tin or tin-lead alloy on copper substrates of a circuit board is removed by the use, for example, of a mixed solution of borofluoric acid and hydrogen peroxide or nitric acid and hydrogen peroxide. Since these solutions contain a strong oxidizing agent such as hydrogen peroxide, they can remove simultaneously in a single step both the layer of tin or tin-lead alloy on the copper substrates and the intermetallic layer of tin and copper, which has been generated at the interface between the copper surface and the layer of tin or tin-lead alloy. However, such a strong oxidative action of the solution causes a serious damage to the copper substrates, especially to the edge of the pattern on the substrates. In order to alleviate this problem, an improved process for greatly decreasing the damage to the substrates by a two-step procedure using two different kinds of reagents for removal of tin and tin-lead alloy has been proposed (U.S. Pat. No. 4,687,545). Although this process could solve the above-mentioned problem to some extent, it entailed a drawback that a large amount of whitish precipitates were inevitably formed in the treating solution during long-term operation.

SUMMARY OF THE INVENTION

Accordingly an object of this invention is to provide a process for removing a layer of tin or tin-lead alloy from the surface of a substrate which comprises the steps of (1) dissolving the layer of tin or tin-lead alloy with a first removing reagent which is capable of oxidatively dissolving metals more reactive than hydrogen in electrochemical series, while retaining the intermetallic layer consisting of tin and copper, and (2) dissolving the remaining intermetallic layer with a second removing reagent which is capable of oxidatively dissolving metals less reactive than hydrogen in electrochemical series, thus causing the copper layer to be exposed.

In a preferred embodiment of the present invention said first removing reagent comprises (a) an aromatic compound having at least one nitro substituent in the aromatic ring thereof, (b) at least one inorganic or organic acid selected from the group consisting of nitric acid, sulfuric acid, borofluoric acid, hydrofluoric acid, sulfamic acid, methane sulfonic acid, glycolic acid, lactic acid and acetic acid, and (c) at least one inorganic or organic compound which liberates a halogen atom or a halogen-containing complex ion in an acidic solution.

In a preferred embodiment of this invention said second removing reagent contains an oxidizing agent selected from ferric chloride, cupric chloride and persulfates.

Other objects, features and advantages of the invention will hereinafter become more readily apparent from the following description.

DETAILED DESCRIPTION OF THE INVENTION AND PREFERRED EMBODIMENTS

When tin or tin-lead alloy is plated on copper substrates, tin atoms break into the lattice-defects of the copper, resulting in formation of the intermetallic layer of tin and copper at the interface between the substrates and the plated layer. It is understood that the oxidation potential of the plated layer of tin or tin-lead alloy on the copper substrates is different from that of the intermetallic layer, a higher degree of oxidation is required to remove the intermetallic layer. In conventional processes, the intermetallic layer is removed by a strong oxidizing agent such as hydrogen peroxide. Essentially, such a strong oxidation shall not be required until the plated layer of tin or tin-lead alloy has entirely been removed and at the time the intermetallic layer begins to be removed. Such a strong oxidation at the stage of removal of tin or tin-lead alloy is decisively harmful and undesirable because it not only causes erosion of the exposed copper substrates at the pattern side, but also forms an undesirable oxidized, insoluble film over the layer of tin or tin-lead alloy. Another drawback of the conventional removing reagents is that they form a great amount of whitish precipitates in the solution during long-term operation.

In the present invention, in order to solve the problems in conventional processes, the layer of tin or tin-lead alloy is removed by two different reagents in a two-step procedure. In the first step, a removing reagent having a comparatively mild oxidation capability, i.e. capable of oxidatively dissolving metals more reactive than hydrogen in electrochemical series, is used. That reagent will act only to the plated layer consisting of tin or tin-lead alloy, and will not remove the intermetallic layer of tin and copper. Since the oxidation capability of the reagent is not so strong as to erode the intermetallic layer and the underlying copper substrates, the copper substrates exposed at the pattern side is scarcely eroded. Further, there is no fear of formation of insoluble oxidized film on the surface of tin or tin-lead alloy which will block removal of the layer of tin and tin-lead. Another feature of the reagent used in the first step is that, an inorganic compound or an organic compound which will liberate halogen ions or complex ions containing halogen atoms incorporated in the reagent prevents formation of aforementioned whitish precipitates in the solution during long-term operation, thus ensuring smooth and rapid removal of the layer of tin and tin-lead alloy.

In the second step, a removing reagent having a comparatively strong oxidation capability, i.e. capable of oxidatively dissolving metals less reactive than hydrogen in electrochemical series, is used to remove the intermetallic layer of tin and copper which has remained on the copper substrates after the first step, resulting in the emergence of the copper substrates. As the thickness of the intermetallic layer is less than 1 $\mu$m, removal of the layer is completed within a few seconds. Since the period of contact is so short that the copper substrates are scarcely eroded even with the reagent having a comparatively strong oxidation capability.

As can be seen from the above description, the present invention provides an improved process in which the layer of tin or tin-lead alloy is readily removed without causing the erosion of the copper substrates, and at the same time, formation of whitish precipitates during long term operation is prevented.

The first and second removing reagents of the present invention are formulated with the following components.

First reagent

The first reagent essentially comprises the following three components.

Component (a) is selected from the group consisting of aromatic nitro compounds having at least one nitro group in an aromatic ring, for example, o-, m- or pnitrobenzensulfonic acid and salts thereof; o-, m- or pnitrobenzoic acid and salts thereof; o-, m- or p-nitrophenol and salts thereof, and the like. Among these, sodium m-nitrobenzenesulfonate is most preferable from the aspect of efficacy and the cost.

The above aromatic substituted compound is essential for said first reagent because it provides to the reagent a moderate oxidation capability sufficient to remove the layer of tin and tin-lead but not to remove the intermetallic layer. The amount to be incorporated is in the range of 1 g/l to 500 g/l, and 5 g/l to 200 g/l is more preferable for practical use. The desired effect will not be obtained with a concentration less than 5 g/l, and a concentration more than 200 g/l will not increase the effect significantly and thus uneconomical.

Component (b) is an inorganic or organic acid selected from the group consisting of nitric acid, sulfuric acid, borofluoric acid, hydrofluoric acid, sulfamic acid, methanesulfonic acid, glycolic acid, lactic acid and acetic acid. Among these, nitric acid is most preferable. Such an inorganic acid or an organic acid is also essential for said first reagent contributing to the dissolution of tin or tin-lead alloy into the reagent. The practical concentration of this component is in the range of 50 g/l to 400 g/l. The dissolution effect of the reagent can not be expected in the concentration less than 50 g/l and that more than 400 g/l will not increase the effect any more and thus uneconomical.

Component (c) is an inorganic or organic compound, such as hydrochloric acid, ammonium chloride, sodium chloride, ammonium fluoride, potassium bromide, fluorotitanates, fluoroaluminates, or the like, which can liberate the halogen ions or halogen-containing complex ions against the inorganic or organic acid of the component (b). Among these, sodium chloride is most preferable.

Such an inorganic or organic compound which liberates halogen ions or halogen-containing complex ions is added for preventing components which have once dissolved into the reagent by the action of the component (b) from precipitating.

The concentration of the component (c) as a sequestrant is, measured as a halogen content, preferably in the range of 0.01 g/l to 200 g/l, more preferably in the range of 1 g/l to 100 g/l. The concentration less than 1 g/l is not effective for the prevention of precipitation, and that more than 100 g/l will not increase the effect any more and thus uneconomical.

Besides the above-described essential components, it is possible to incorporate optional additives such as surface finishers for the tin or tin-lead alloy layer, solubilizers, or the like.

Thus, the first reagent of the present invention can prevent formation of the precipitates, and can contribute to the smooth removal of tin or tin-lead alloy.

Second reagent

As the second reagent of the present invention, a conventional removing reagent comprising an aqueous solution of an inorganic acid or an organic acid containing hydrogen peroxide is applicable. However, since hydrogen peroxide contained in such a reagent is unstable and hazardous, it is preferable to use a more stable oxidizing agent as a primary component of the second reagent. Such a component is preferably selected from the oxidizing agents consisting of ferric chloride, cupric chloride and ammonium persulfate.

The concentration of the above oxidizing agent in said second reagent is in the range of 0.5 g/l to 100 g/l, and practically in the range of 1.5 g/l to 4 g/l. If the concentration is less than 1.5 g/l, the effect will not be satisfactory in terms of the unit weight of the second reagent, and if it is more than 4 g/l the copper substrates may be eroded.

There is no restriction as to the application methods of the two reagents insofar as the layer of tin or tin-lead alloy and the intermetallic layer of tin and copper can be well removed. Besides conventional methods such as dipping, any other methods, e.g. spraying, can be applied.

Other features of the invention will become apparent in the course of the following description of the exemplary embodiments which are given for illustration of the invention and are not intended to be limiting thereof.

EXAMPLES

Example 1

The first reagent and the second reagent were prepared as follows:

| First reagent | |
|---|---|
| Sodium m-nitrobenzenesulfonate | 100 g/l |
| Nitric acid | 400 g/l |
| Glycolic acid | 100 g/l |
| Sodium chloride | 10 g/l |
| Water is added to make the total volume 1,000 ml. | |
| Second reagent | |
| Ferric chloride | 3 g/l |
| Water is added to make the total volume 1,000 ml. | |

A solder comprising 60% by weight of tin and 40% by weight of lead was plated onto an epoxy-glass plate with copper patterns (The thickness of the solder: 10μ). The plated board was dipped in the first reagent at 40° C., and the layer of the solder was removed in 30 seconds, but the intermetallic layer of tin and copper was not removed and remained. The board was kept dipped for another 60 minutes, still the intermetallic layer was not removed. Thereafter, the board was dipped in the second reagent at 25° C., then the intermetallic layer was entirely removed in 5 seconds and the surface of the copper substrate was exposed.

A series of similar soldered boards were prepared and dipped sequentially in the first reagent and in the second reagent, until the amount of the dissolved solder in the first reagent reached 80 g/l. Then, the reagent was left over one day but no whitish precipitates were found in the reagent.

On the other hand, in the case that sodium chloride was not added in the first reagent, the whitish precipitates were observed when the amount of the dissolved solder reached 40 g/l.

Example 2

The first reagent and the second reagent were prepared as follows:

| First reagent | |
|---|---|
| Sodium m-nitrobenzenesulfonate | 100 g/l |
| Sulfamic acid | 200 g/l |
| Ammonium fluoride | 20 g/l |
| Water was added to make the total volume 1,000 ml. | |
| Second reagent | |
| Ammonium persulfate | 3 g/l |
| Water was added to make the total volume 1,000 ml. | |

A similar soldered board as described in Example 1 was prepared and dipped in the first reagent at 40° C. The solder layer was removed in 45 seconds, and the intermetallic layer of tin and copper was not removed. The intermetallic layer was not removed even after a further 60 minutes dipping.

The board from which the solder layer had been removed was dipped in the second reagent at 25° C., then the intermetallic layer was entirely removed in 5 seconds, and the copper surface was exposed.

A series of similar soldered boards were prepared and dipped sequentially in the first reagent and in the second reagent, until the amount of the dissolved solder in the first reagent reached 80 g/l. Then, the first reagent was left over one day, but no whitish precipitates were found.

On the other hand, in the case that the sodium fluoride was not added in the first reagent, whitish precipitates were observed when the amount of the dissolved solder reached 30 g/l.

Obviously, numerous modifications and variations of the present invention are possible in light of the above teachings. It is therefore to be understood that within the scope of the appended claims, the invention may be practiced otherwise than as specifically described herein.

What is claimed is:

1. A process for removing a layer of tin or tin-lead alloy from the surface of a copper substrate on which the tin and tin-lead alloy layer has been formed, which comprises the steps of:
   (1) dissolving the layer of tin or tin-lead alloy by exposure to a first solution containing a first removing agent which is capable of oxidatively dissolving metals more reactive than hydrogen in electrochemical series, while retaining an intermetallic layer of tin and copper, said first solution consisting essentially of
      (a) an aromatic compound having at least one nitro substituent in the aromatic ring thereof,
      (b) at least one inorganic or organic acid selected from the group consisting of nitric acid, sulfuric acid, borofluoric acid, hydrofluoric acid, sulfamic acid, methane sulfonic acid, glycolic acid, lactic acid and acetic acid, and
      (c) at least one compound which liberates a halogen atom or a halogen-containing complex ion in an acidic solution selected from the group consisting of hydrochloric acid, ammonium chloride, sodium chloride, ammonium fluoride, potassium bromide, fluorotitanates, and fluoroaluminates;
   (2) dissolving the remaining intermetallic layer of tin and copper by exposure to a second solution containing a second removing agent which is capable of oxidatively dissolving metals less reactive than hydrogen in electrochemical series, thus causing the copper substrate to be exposed.

2. A process according to claim 1, wherein said second removing reagent contains an oxidizing agent selected from ferric chloride, cupric chloride and persulfates.

3. A process according to claim 1, said layer of tin and tin-lead alloy has been formed as a resist on a copper substrate for a printed circuit board.

* * * * *